(12) United States Patent
Nequist

(10) Patent No.: US 7,904,862 B2
(45) Date of Patent: Mar. 8, 2011

(54) METHOD AND MECHANISM FOR PERFORMING CLEARANCE-BASED ZONING

(75) Inventor: Eric Nequist, Monte Sereno, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 534 days.

(21) Appl. No.: 11/964,676

(22) Filed: Dec. 26, 2007

(65) Prior Publication Data

US 2009/0172625 A1 Jul. 2, 2009

(51) Int. Cl.
*G06F 17/50* (2006.01)

(52) U.S. Cl. .................. 716/112; 716/52; 716/111

(58) Field of Classification Search ............. 716/4–5, 716/52, 111, 112
See application file for complete search history.

(56) References Cited

U.S. PATENT DOCUMENTS

| | | | |
|---|---|---|---|
| 5,157,618 A | 10/1992 | Ravindra et al. | |
| 5,281,558 A | 1/1994 | Bamji et al. | |
| 5,481,473 A | 1/1996 | Kim et al. | |
| 5,805,860 A | 9/1998 | Parham | |
| 5,911,061 A | 6/1999 | Tochio et al. | |
| 6,035,106 A | 3/2000 | Carruthers et al. | |
| 6,189,132 B1 * | 2/2001 | Heng et al. | 716/11 |
| 6,253,363 B1 | 6/2001 | Gasanov et al. | |
| 6,324,675 B1 | 11/2001 | Dutta et al. | |
| 6,349,403 B1 | 2/2002 | Dutta et al. | |
| 6,505,327 B2 | 1/2003 | Lin | |
| 7,100,129 B1 | 8/2006 | Salowe et al. | |
| 7,222,322 B1 * | 5/2007 | Chyan et al. | 716/12 |
| 7,454,721 B2 * | 11/2008 | Hibbeler et al. | 716/2 |
| 7,487,479 B1 * | 2/2009 | Malik et al. | 716/5 |
| 2002/0059194 A1 | 5/2002 | Choi et al. | |
| 2005/0044514 A1 * | 2/2005 | Wu et al. | 716/5 |

* cited by examiner

*Primary Examiner* — Vuthe Siek
(74) *Attorney, Agent, or Firm* — Vista IP Law Group LLP

(57) ABSTRACT

A method and mechanism is disclosed for identifying spacing and clearance based rule violations in an IC design. Shadows are employed to identify spacing and clearance based rule violations. The shadow approach of is particularly useful to identify width-dependent spacing and clearance violations, while avoiding false positives that exist with alternate approaches. The embodiments can be used with any type, configuration, or shape of layout objects.

27 Claims, 16 Drawing Sheets

Goto Fig. 6b

Fig. 8b
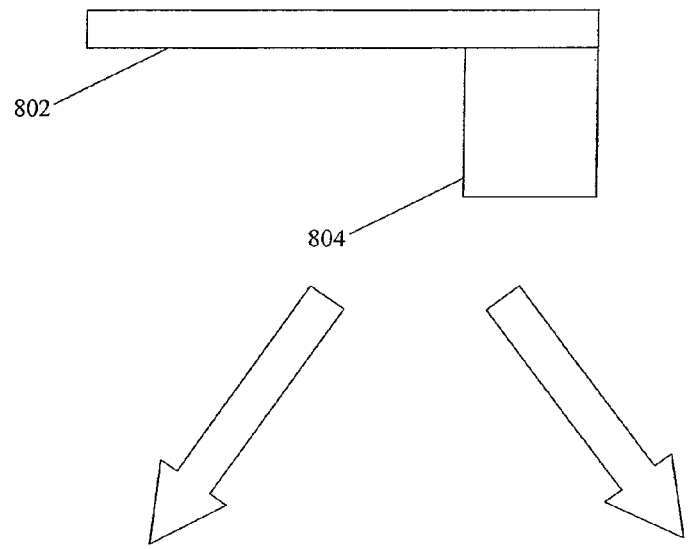
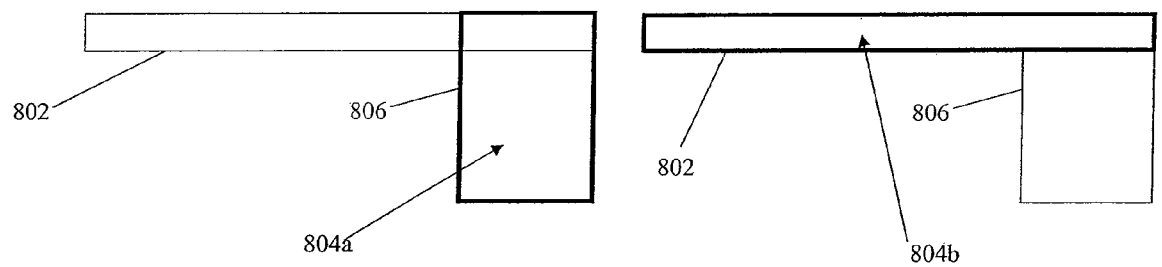
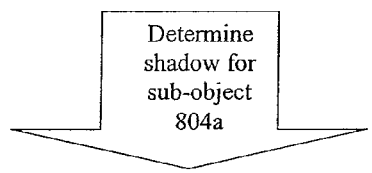
Goto Fig. 8c

Overlap both shadows for sub-objects

Goto Fig. 8e

Combine shadows for sub-objects

Goto Fig. 8f

METHOD AND MECHANISM FOR PERFORMING CLEARANCE-BASED ZONING

BACKGROUND

The invention relates to technology for implementing electronic design automation tools, and in particular, to design tools that perform verification of rules for an integrated circuit ("IC") design.

An IC is a small electronic device typically formed from semiconductor material. Each IC contains a large number of electronic components, e.g., transistors, that are wired together to create a self-contained circuit device. The components and wiring on the IC are materialized as a set of geometric shapes that are placed and routed on the chip material. During placement, the location and positioning of each geometric shape corresponding to an IC component are identified on the IC layers. During routing, a set of routes are identified to tie together the geometric shapes for the electronic components.

One or more verification processes are performed on the IC layout to ensure that the design abides by all of the detailed rules and parameters that have been specified for the manufacturing process, e.g., during design rule checking ("DRC"). The design rules are usually provided by a foundry as part of an organized rule deck. Violating even a single foundry rule runs the risk that the silicon product will be manufactured correctly or will not work for its intended purpose. Therefore, it is critical that thorough verification processing is performed before finalizing an IC design.

Rule verification may be performed frequently and at many stages of the IC design process. For example, verification may be used during design and at tape-out to ensure compliance with physical and electrical constraints imposed by the manufacturing process. In addition, verification may be performed during the design process, such as during the placement and routing process, to identify legal configurations of objects in a layout.

There are many types of design rules that are used to implement an IC design. A common type of design rule is the "spacing" rule. Spacing rules are established to ensure that adequate spacing exists between any two objects/shapes on the IC design. These rules are usually established by the foundry that will produce the IC chip.

"Width-dependent" spacing or clearance rules may also be established for an IC design. With modern, advanced technology, the minimum spacing between two objects on the IC design may be relative to the width of the two metal shapes. For example, if the metal width is X, then the spacing between this metal with the next space to the adjacent metal may need to be distance d. If the metal width is 2x, then the spacing between this metal with the next space to the adjacent metal may need to be wider, e.g., a distance of 1.5 d.

As modern IC designs become larger and more complex over time, greater numbers of circuit components are needed on the IC to implement those designs. This means that more and smaller shapes at greater complexities are placed on IC layout in closer proximities to each other. This problem is exacerbated by constantly improving IC manufacturing technologies that can create IC chips at ever-smaller feature sizes, which allows increasingly greater quantities of transistors to be placed within the same chip area, as well resulting in more complex physical and lithographic effects during manufacture. As a result, it becomes more and more difficult for design tools to adequately and efficiently perform verification of spacing and clearance rules.

Therefore, there is a need for improved techniques to address and verify spacing and clearance rules for modern IC designs.

SUMMARY

Embodiments of the present invention provide a method, system, and computer program product for identifying spacing and clearance based rule violations in an IC design. According to some embodiments, shadows are employed to identify spacing and clearance based rule violations. The shadow approach of is particularly useful to identify width-dependent spacing and clearance violations, while avoiding false positives that exist with alternate approaches. The embodiments can be used with any type, configuration, or shape of layout objects.

Further details of aspects, objects, and advantages of the invention are described below in the detailed description, drawings, and claims. Both the foregoing general description and the following detailed description are exemplary and explanatory, and are not intended to be limiting as to the scope of the invention.

BRIEF DESCRIPTION OF DRAWINGS

FIG. 3b illustrates an example drawback with using the oversized analysis window approach of FIG. 3a.

FIGS. 8a-f illustrate an approach for generating a shadow.

DETAILED DESCRIPTION

Embodiments of the present invention provide a method, system, and computer program product for identifying spacing and clearance based rule violations in an IC design. According to some embodiments, shadows are employed to identify spacing and clearance based rule violations. The shadow approach of is particularly useful to identify width-dependent spacing and clearance violations, while avoiding false positives that exist with alternate approaches. The embodiments can be used with any type, configuration, or shape of layout objects.

Figure 1:
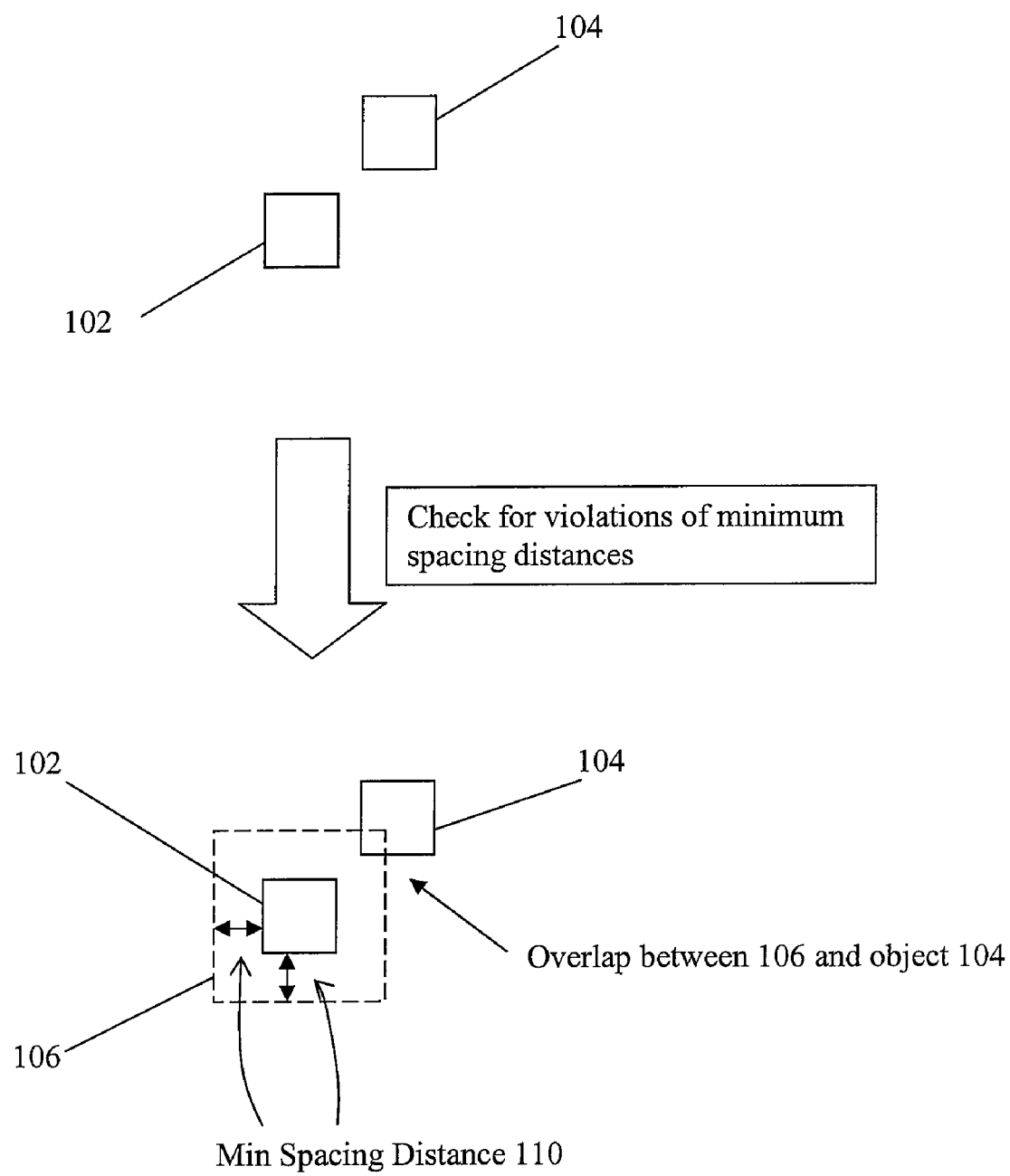
FIG. 1 illustrates an example approach for detecting spacing rule violations.

FIG. 1 illustrates an approach for identifying the existence of spacing violations in an IC design. In this illustrated example, there are two objects 102 and 104 that are near each other on a layout. It is desirable to check whether the objects are spaced a sufficient distance apart from each other such that they do not violate any spacing rules.

One approach to perform the spacing rule check is to focus on one of the objects, and to then extend the minimum spacing distance from the edge of the object to see if there are any other objects that intersect or fall within that extended distance. In the present example, assume that a focus is placed on object 102. The minimum spacing distance 110 is extended from the edges of object 102 to create an extended analysis area or window having boundaries 106. As illustrated in FIG. 1, it can be seen that the other object 104 overlaps with the boundaries 106 of the extended area around object 102. Therefore, a violation of the minimum spacing rule has been detected, and can therefore be corrected prior to finalization and tape-out of the IC design.

The drawback with this approach is that it does not adequately take into account width-dependent clearance rules. When working with width-dependent clearance rules, it is quite possible that objects exist in the layout for which the required clearance distance exceeds the minimum spacing rules. As a result, it is possible that the approach of FIG. 1 to check for violations of minimum spacing rules will not identify violations of clearance distance requirements that are different from the minimum spacing rules.

Figure 2:
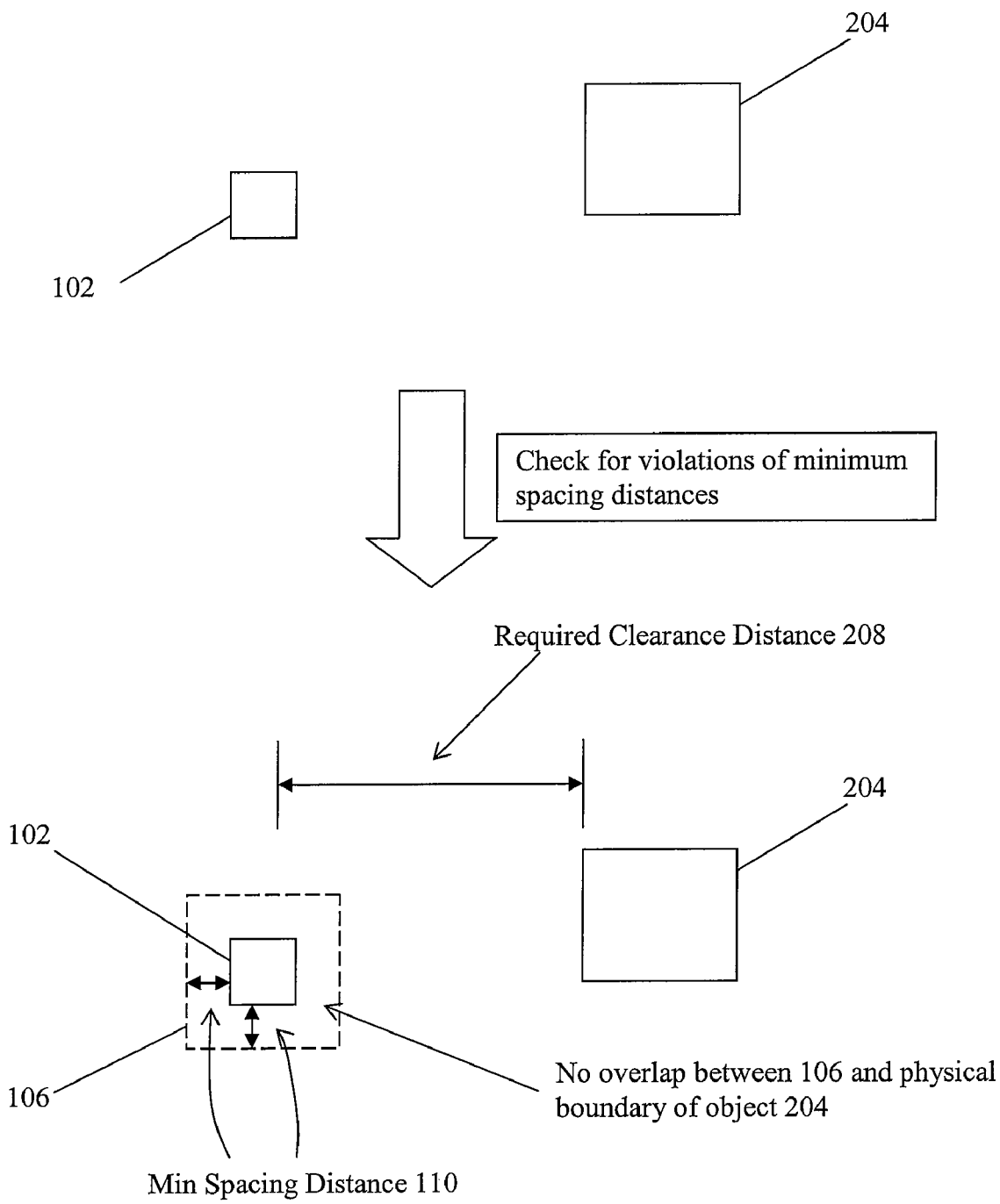
FIG. 2 illustrates an alternate approach for detecting spacing rule violations.

To explain, consider the configuration of objects shown in FIG. 2. This portion of a layout includes a first small object 102 and a second larger object 204. Assume that object 204 is large enough such that width-dependent rules require a minimum clearance distance of 208 surrounding object 204.

Using the previously described approach, a focus is placed on object 102, where the verification process extends the minimum spacing distance from the edge of the object to see if there are any other objects that intersect or fall within that extended distance. In the present example, the minimum spacing distance 110 is extended from the edges of object 102 to create an extended analysis area having boundaries 106.

It is noted that there is no physical overlap between the edges of object 204 and the boundaries 106 of the extended area around object 102. As a result, no violation will be detected using an analysis window having boundaries 106. However, object 102 is too close to object 204, since the distance between object 102 and object 204 is less than the width-dependent clearance distance 204. This creates a violation of clearance-based spacing requirements that cannot be detected by the present verification approach. This undetected violation of a width-dependent clearance/spacing rule could result in manufacturing or performance defects in the eventual IC product.

One possible solution to this problem is to over-expand the analysis window of an object that is being analyzed. The general idea is that the largest width-dependent clearance distance for a given layer or design is used as the distance for the over-expansion. In this way, the over-expanded analysis window will be guaranteed to identify all clearance-based spacing violations.

This approach is illustrated in FIG. 3a, which again shows a first smaller object 102 and a second larger object 204. As before, assume that object 204 is large enough such that width-dependent rules require a minimum clearance distance of 208 surrounding object 204.

Under the previously described approach, a focus is placed on object 102 where the verification process extends only by the minimum spacing distance from the edge of the object 102 to see if there are any other objects that intersect or fall within that extended distance. In this approach, the minimum spacing distance 110 is extended from the edges of object 102 to create an extended area having boundaries 106a. As previously noted this boundary 106a is insufficient to identify the clearance-based spacing violation for the required width-dependent clearance distance 208.

Figure 3A:
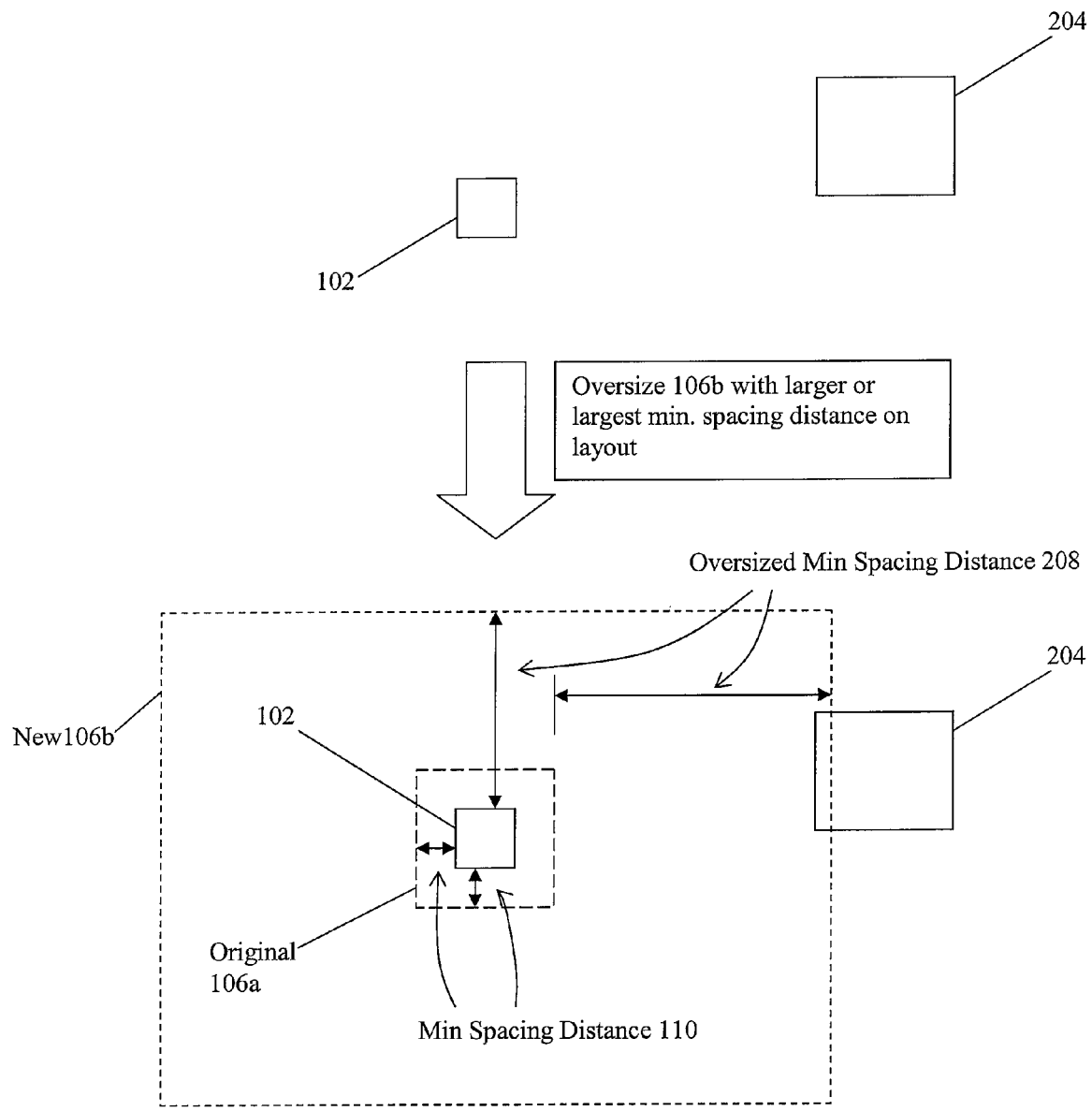
FIG. 3a illustrates an example approach for using oversized analysis windows to detect spacing rule violations.

Under the new approach, the analysis window is over-expanded by the larger width-dependent distance 208 to create an analysis window having expanded boundaries 106b. As shown in the bottom of FIG. 3a, the expanded boundaries 106b extend far enough such that it intersects with the edges of object 204. Therefore, this alternative approach to over-expand the analysis window will detect the violation of the width-dependent clearance distance 208 that was not identified by the approach of FIG. 1.

However, under certain circumstances, this alternative approach may also suffer from significant disadvantages. The reason is that the over-expanded analysis window may encompass and mistakenly identify violations for other objects for which there are no requirement to be spaced apart by the larger width-dependent clearance distance.

Figure 3B:
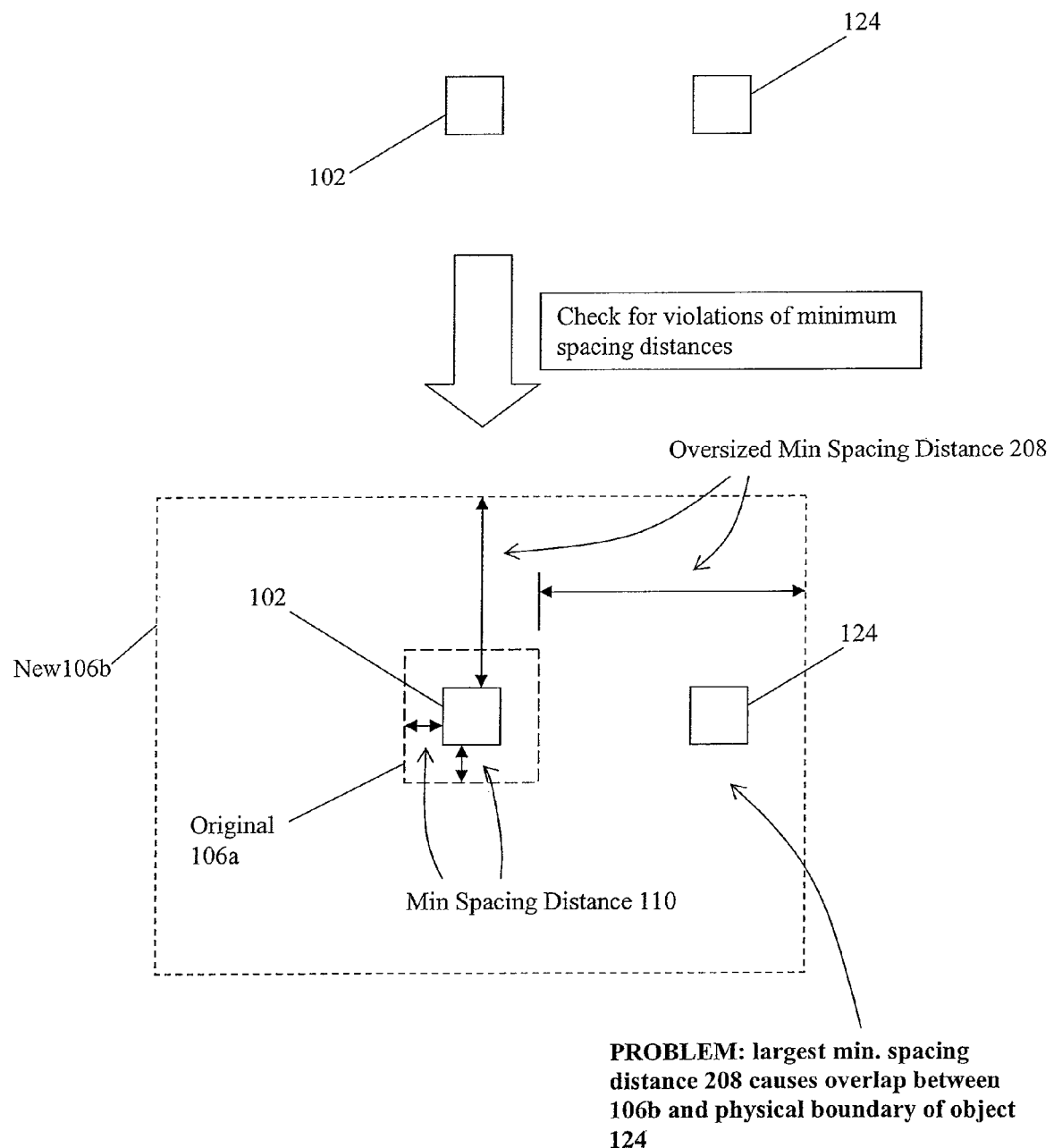

This situation is illustrated in the example layout of FIG. 3b. This figure shows a first object 102 and a second object 124. Assume that object 124 is small enough such that it does not need to comply with the width-dependent clearance distance 208 that was needed to address object 204. Nevertheless, to ensure that there are no spacing violations for objects on the layout that need to comply with the width-dependent clearance distance 208, an over-expanded analysis window is created around object 102 based upon distance 208. The expanded boundaries 106b of the over-expanded analysis window extends far enough such that it encompasses object 124. Therefore, this approach will mistakenly identify a violation of the width-dependent clearance distance 208, even though object 124 is not subject to that clearance rule. It is noted that the previous approach would not have made this false identification of a design error, since the smaller boundary 106a does not intersect or encompass object 124.

Some embodiments of the invention provide an improved approach that uses "shadows" to address this as well as other problems with the other approaches. A shadow refers to an expanded boundary for objects on the layout corresponding to an extended clearance-based spacing distance. For an object subject to such an expanded clearance-based distance, a shadow will be created that tracks this expanded distance around the object. In effect, the shadow creates a secondary shape surrounding an original shape which identifies the true spacing distance requirements for that shape. Any other objects that intersect or fall within the shadow could be detected as a possible violation of the design rules.

Figure 4:
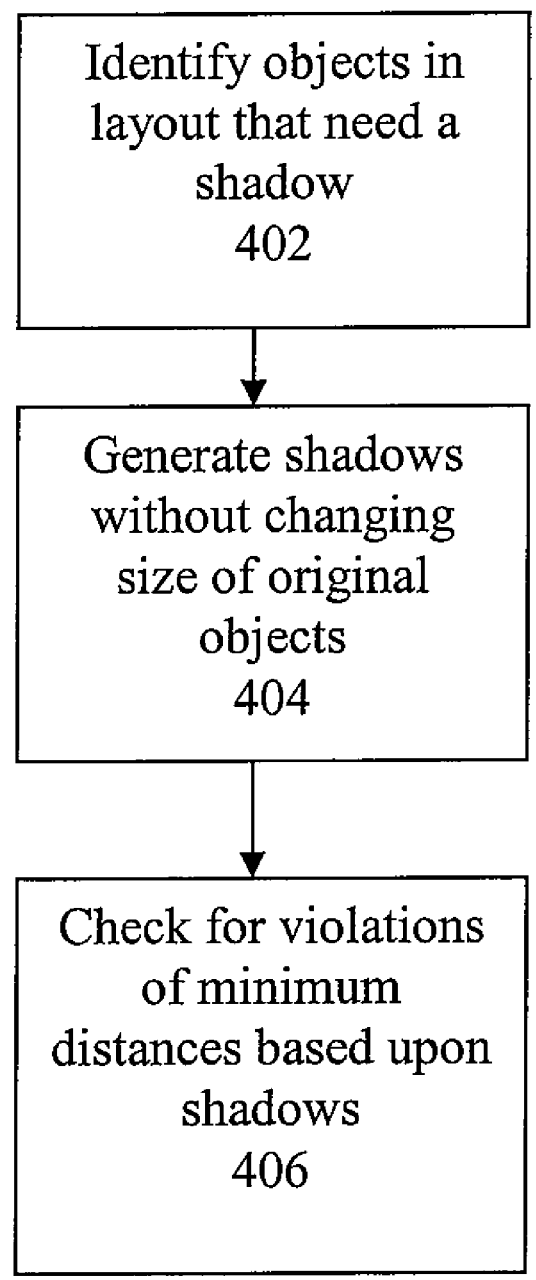
FIG. 4 shows a flowchart of a process for using a shadow to identify spacing rule violations.

FIG. 4 shows a flowchart of a process for implementing shadows to check spacing and clearance rules according to some embodiments of the invention. At 402, the process identifies the objects in the layout for which a shadow is needed. Not every object in a layout requires a shadow. There are many objects in a layout which are subject only to the minimum or standard spacing rule distances, including many of the smaller objects on a layout. The objects subject to standard minimum spacing rule distances would not be need a shadow. However, there will likely be several classes of objects on the layout that will be subject to larger clearance rules for spacing, and would therefore be associated with a shadow according to embodiments of the invention.

At 404, shadows are generated without changing the size the original objects. By creating shadows in this manner, the true shape of the original object is maintained in the IC design to allow other EDA design and verification operations to be performed upon those true shapes. A first approach to accomplishing this is by creating an entirely new object for the design file that is specifically designated as a shadow object, but which corresponds to the original object and has a size corresponding to the expanded size of the clearance spacing distance. In this approach, the original object is unaffected and co-exists with the new design object. A second approach is to create an abstracted shape as the shadow that is cast by the original object, but which does not exist as a separate design object. One approach for implementing this abstracted shadow is the approach described in U.S. Pat. No. 6,983,440, which is hereby incorporated by reference in its entirety.

At 406, violations of the minimum spacing and clearance rules can be checked by analysis the layout using the shadows. Any objects that intersect with or fall within the boundaries of the shadows would indicate the possible violation of a spacing or clearance rule. One possible approach that can be taken to detect such intersections is disclosed in U.S. Pat. No. 7,100,128, which is hereby incorporated by reference in its entirety.

Figure 5:
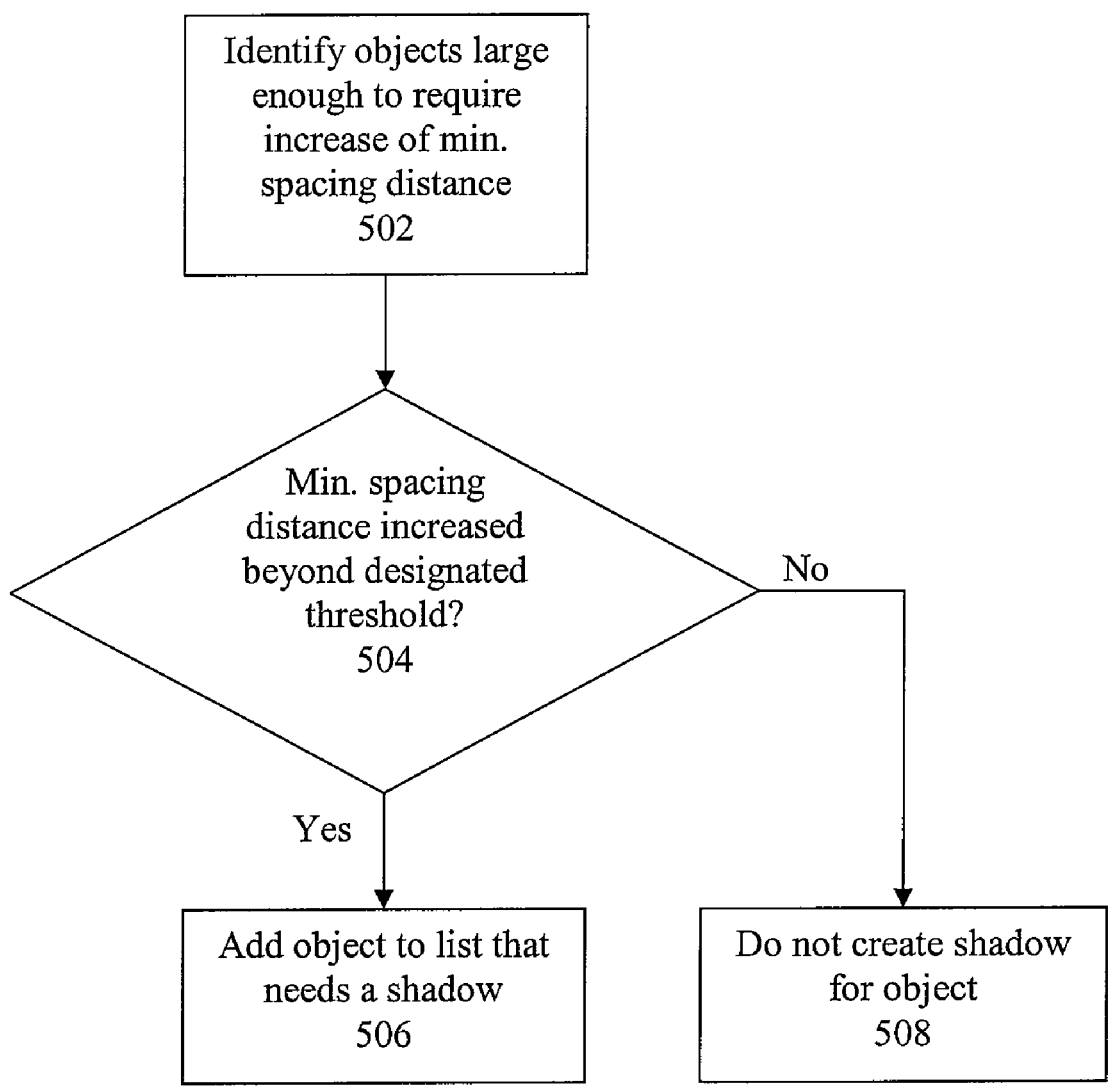
FIG. 5 shows a flowchart of a process for determining which objects should be associated with a shadow.

FIG. 5 shows a flowchart of a process for determining which objects should be associated with shadows according to embodiments of the invention that need to consider width-dependent spacing or clearance rules. At 502, the process identifies objects that are large enough to require an increase of minimum spacing rules. As previously stated, not every object on the layout requires its own corresponding shadow. In many cases, smaller objects on the layout will not be subjected to increased spacing rule requirements. However, to the extent an object is large enough to be affected by greater spacing requirements, then those objects would be identified by 502.

Next at 504, a determination is made whether the objects identified in 502 required enough of an increased clearance or spacing distance such that it meets a designated threshold. According to some embodiments, not every object large enough to require greater spacing under width-dependent rules deserves to have a shadow. Thresholds levels can be set to identify objects that correspond to a large enough increase in required spacing distances that would require a shadow. The threshold can be an absolute amount of required increased spacing distance. Alternatively, the threshold level could be set as a percentage increase in the required spacing distance. As yet another alternative, every increase in required spacing distance, no matter how large or small, could be used to create a shadow.

If the increase in required spacing or clearance distances is sufficiently large, then a shadow is created at 506. If not, then at 508 no shadow is created for the layout object.

Figure 6A:
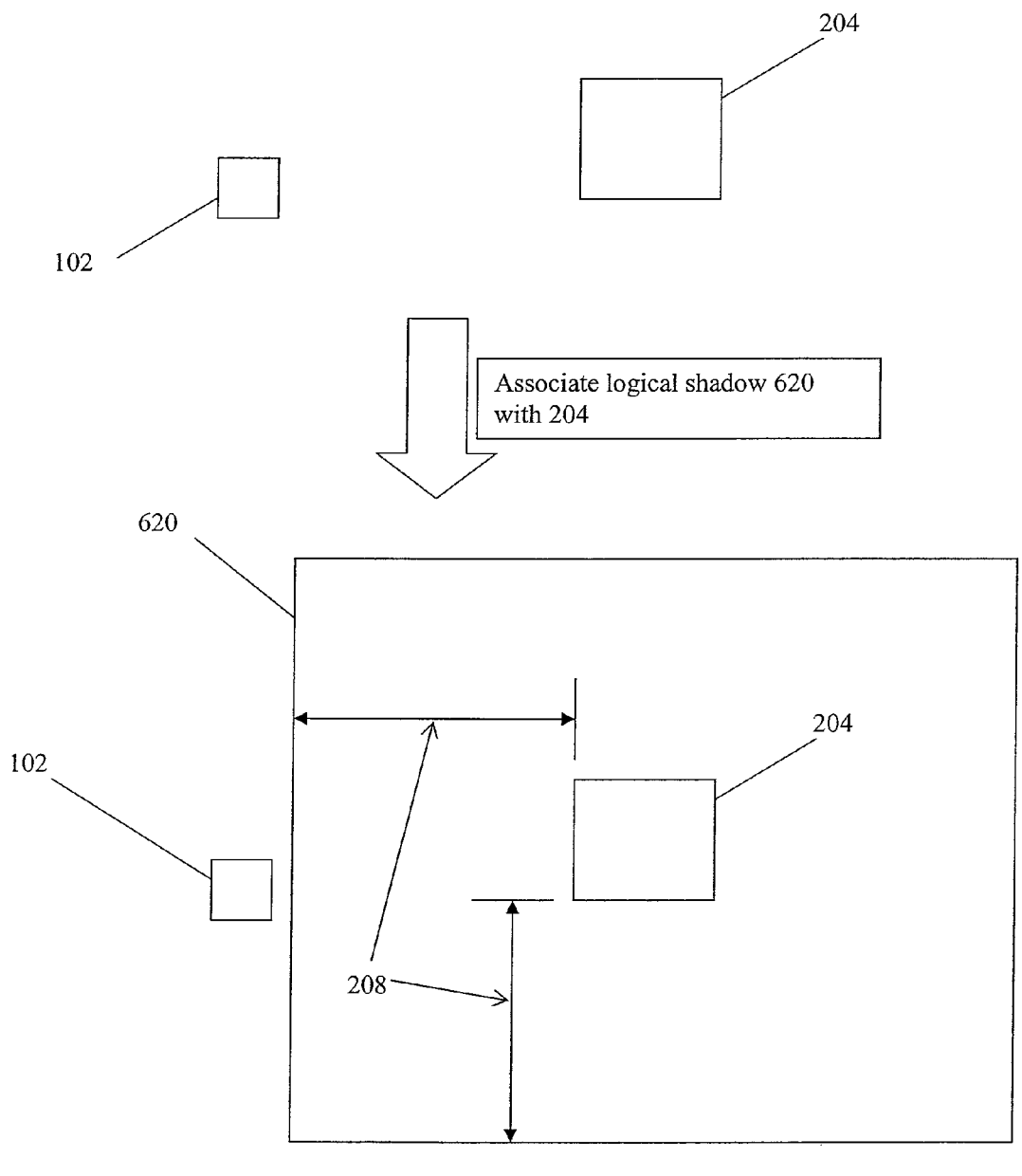
FIGS. 6a-b illustrate an approach for shadows to identify spacing rule violations.

FIG. 6a provides an illustrated example of an embodiment of the invention as applied to eh example layout of FIG. 2. The example layout includes a first smaller object 102 and second larger object 204. As before, assume that object 204 is large enough such that width-dependent rules require a minimum clearance distance of 208 surrounding object 204. Therefore, a shadow 620 is created having boundaries that are spaced the width-dependent clearance distance 208 away from object 204.

Figure 6B:
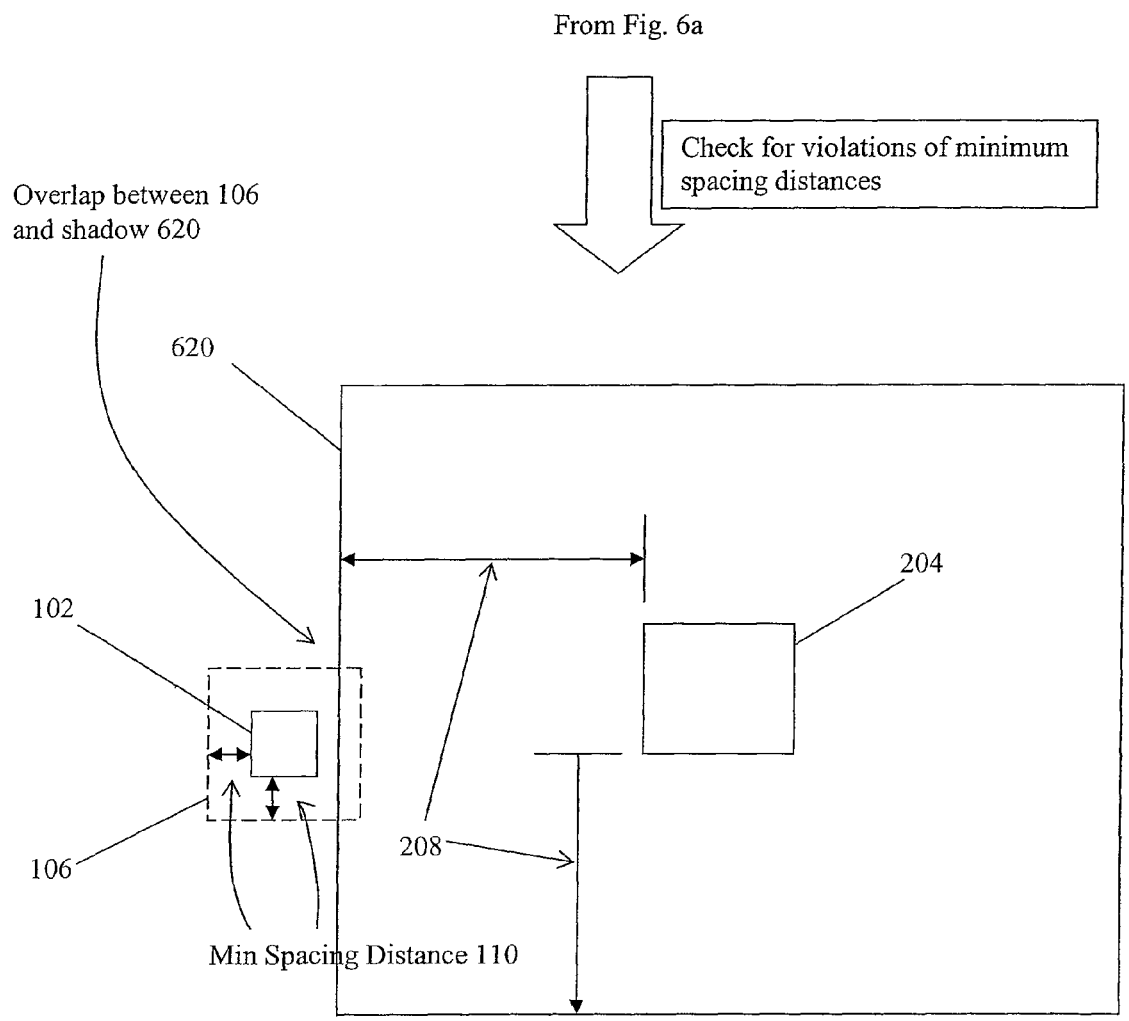

Other objects on the layout would use analysis windows at the standard minimum spacing distances to check for clearance and spacing rule violations. For example, as shown in FIG. 6b, an analysis window is formed around object 102, where the analysis window has boundaries 106 that extend only the minimum spacing distance 110 from the edge of the object 102.

In the present example, the boundary 106 of analysis window around object 102 would intersect with the boundary of shadow 620. Therefore, this process is able to detect the possible clearance/spacing violation between objects 102 and 204. As a result, the violation can be corrected prior to finalization of the design. According to some embodiments, the spacing distance 110 that is used to create boundary 106 allows the verification process to implicitly account or factor in the minimum spacing rule distance with respect to shadow 620. As a result, even though shadow 620 does not intersect or overlap directly with object 102, there is still a violation since the shadow 620 falls within the minimum spacing rule distance 110 around object 102.

One significant advantage of the present approach is that it will not create the "false positives" associated with the approach of FIG. 3a, since the analysis window around object 102 only extends outward by the minimum spacing rule distance. This means that the analysis window around object 102 will not detect violations unless another object is actually within the boundaries of the minimum analysis window or unless a shadow falls within or intersects the analysis window—smaller objects that do not cast a larger shadow will not be inadvertently and mistakenly identified for spacing rule violations. Another advantage of the approach is that it accomplishes the effect of the extended distance for the shadow, while still concurrently allowing the design to retain the original design information of the object 204.

Figure 7:
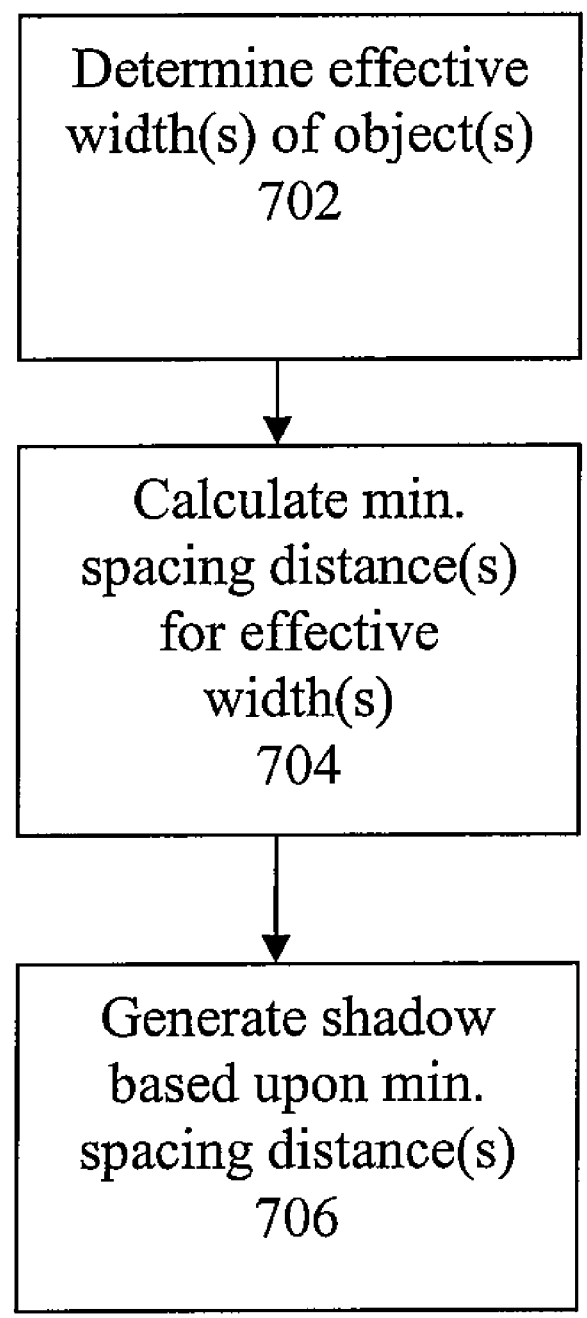
FIG. 7 shows a flowchart of a process for generating a shadow.

The embodiments of the invention may be applied to any objects having any shape or size in the layout. FIG. 7 shows a flowchart of an example approach that can be taken to generate a shadow for any arbitrarily shaped object or combination of objects. At 702, the process identifies the effective widths of sub-object(s) within the object or combination of objects being analyzed. This action decomposes a large object by looking at the smallest widths in the vertical and/or horizontal directions of the objects or combined objects to form a set of contiguous sub-objects. Next, at 704, width-dependent spacing or clearance rules are applied to the sub-objects to determine the minimum spacing distances that must be applied for the sub-objects. This determination is made for each sub-object that has been identified within the larger object or combination of objects. The boundaries of the final shadow would be formed by combining all of the shadows for the sub-objects. This combination can be performed, for example, by performing a logical OR upon the area of all of the shadows.

Figure 8A:
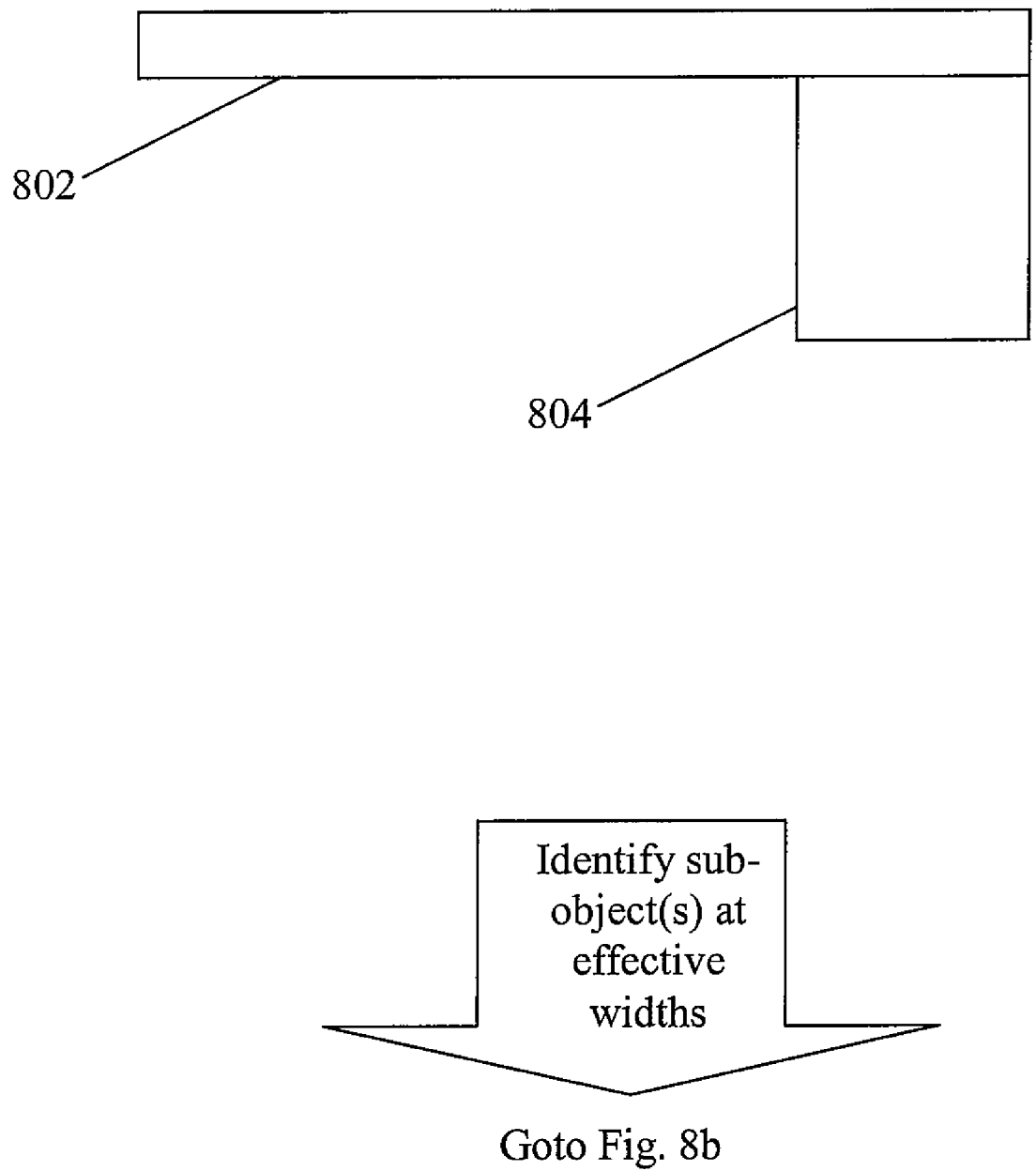

FIGS. 8a-f illustrate this process applied to an example layout. FIG. 8a shows two objects 802 and 804 that abut one another, effectively forming a larger combined shape, where the larger combined shape has an irregular "L" appearance. Assume that a shadow need to be determined for this combination of shapes 802 and 804.

Referring to FIG. 8b, the combined larger shape for objects 802 and 804 is decomposed into smaller sub-objects 804a and 804b. Sub-object 804a is identified based upon a process of identifying the smallest effective width in the horizontal direction for the combined shapes 802 and 804, which essentially results in identification of the rectangular shape for sub-object 804a. Sub-object 804b is identified based upon a process of identifying the smallest effective width in the vertical direction for the combined shapes 802 and 804, which essentially results in identification of the thin rectangular shape for sub-object 804b.

Figure 8C:
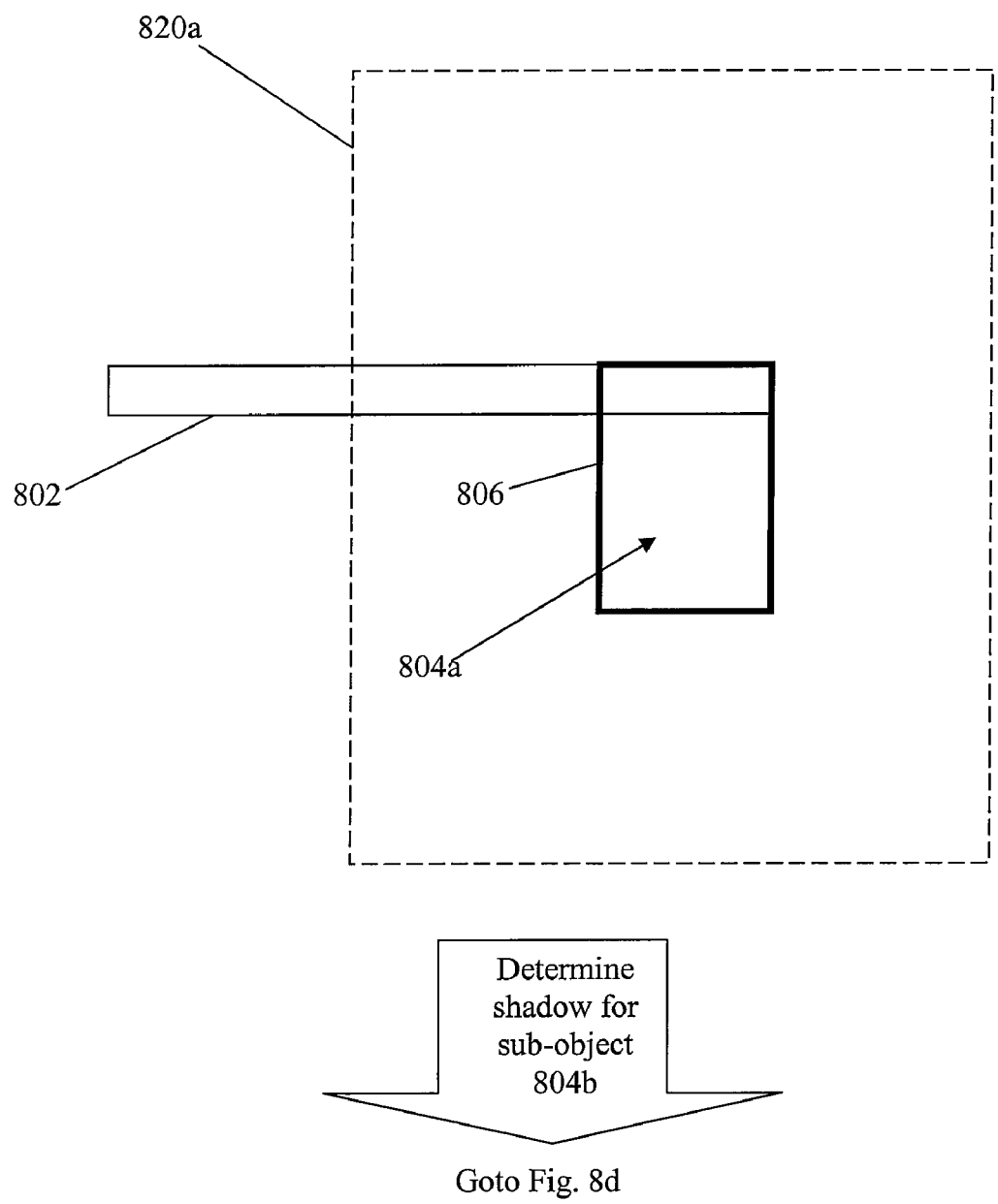
Figure 8D:
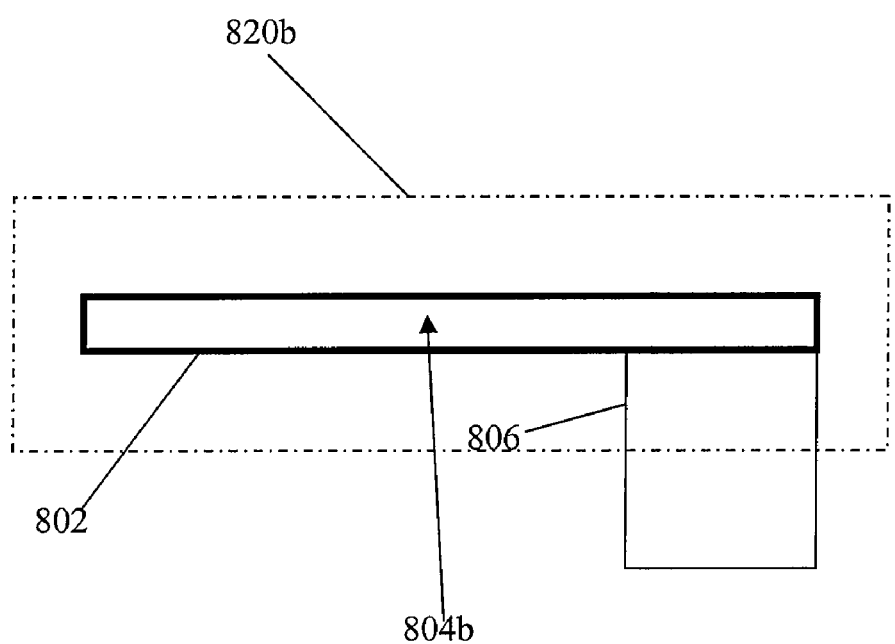

Next, shadows for each of the sub-objects 804a and 804b will be determined. FIG. 8c shows a shadow 820a that has been formed around sub-object 804a. The boundaries of shadow 820a is determined by considering width-dependent spacing rules to identify minimum clearance or spacing distances in both the vertical and horizontal directions from the edges of object 804a. FIG. 8d shows a shadow 820b that has been formed around sub-object 804b. The boundaries of shadow 820b is determined by considering width-dependent spacing rules to identify minimum clearance or spacing distances in both the vertical and horizontal directions from the edges of object 804b.

Figure 8E:
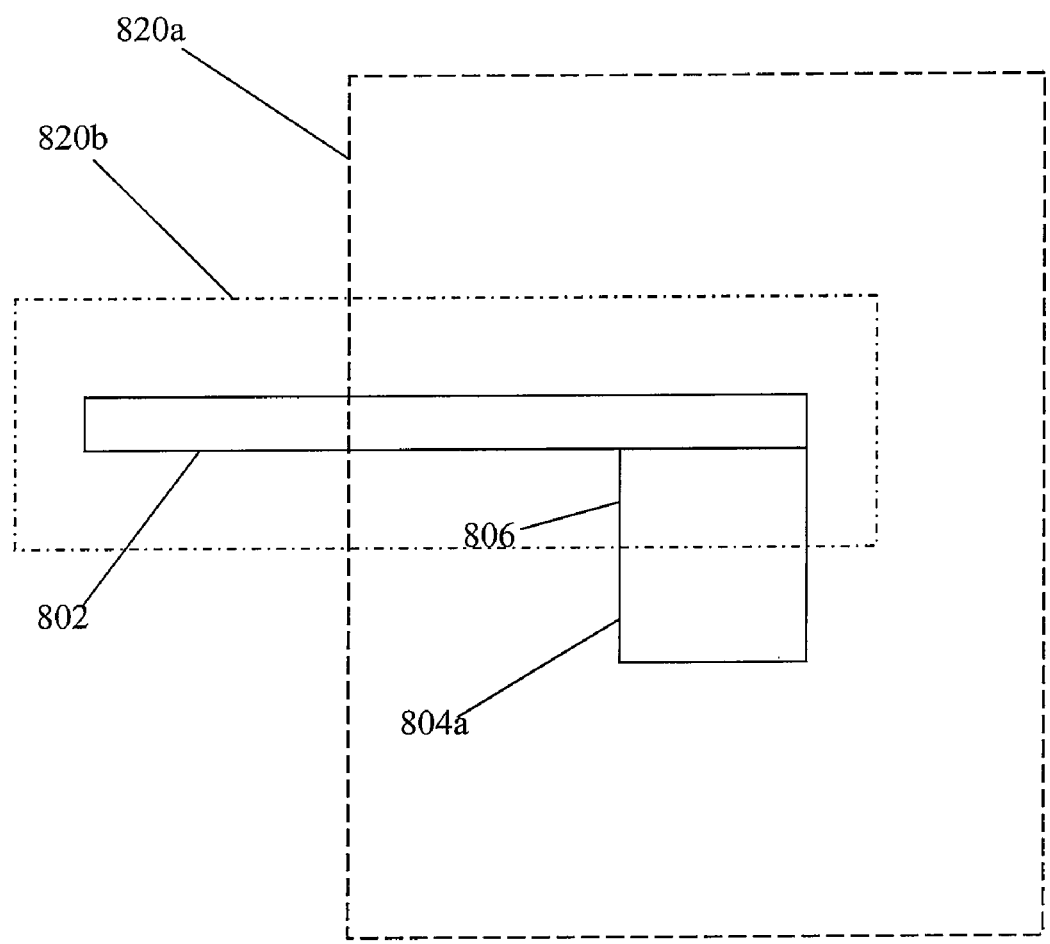

FIG. 8e illustrates the overlapping areas encompassed by shadows 820a and 820b for sub-objects 804a and 804b, respectively. It can be seen that the size and configurations of the shadows for sub-objects may significantly differ from each other. To create the shadow for the overall object or combination of objects 802 and 806, the shadows 820a and 820b for the sub-objects 804a and 804b will be combined together.

Figure 8F:
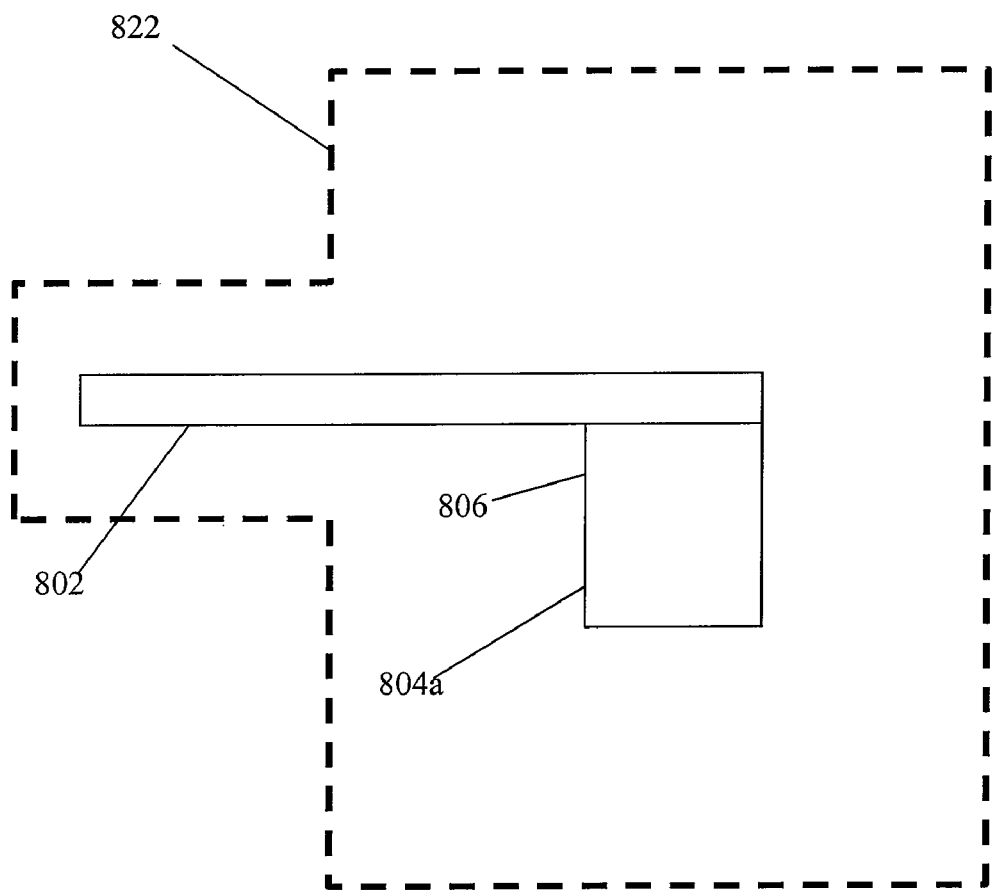

FIG. 8f shows the final shadow 822 that is formed by combining shadows 820a and 820b together for the sub-objects 804a and 804b. This combination is based upon a logical OR operation that is performed against the areas encompassed by shadows 820a and 820b. This shadow 822 can be used to identify any spacing or clearance rule violations based upon the proximity of other objects within the boundaries of shadow 822.

Therefore, what has been disclosed is an approach for identifying spacing and clearance based rule violations in an IC design. The shadow approach of the present embodiment is particularly useful to identify width-dependent spacing and clearance violations, while avoiding false positives that exist with alternate approaches. The embodiments can be used with any type, configuration, or shape of layout objects.

System Architecture Overview

Figure 9:
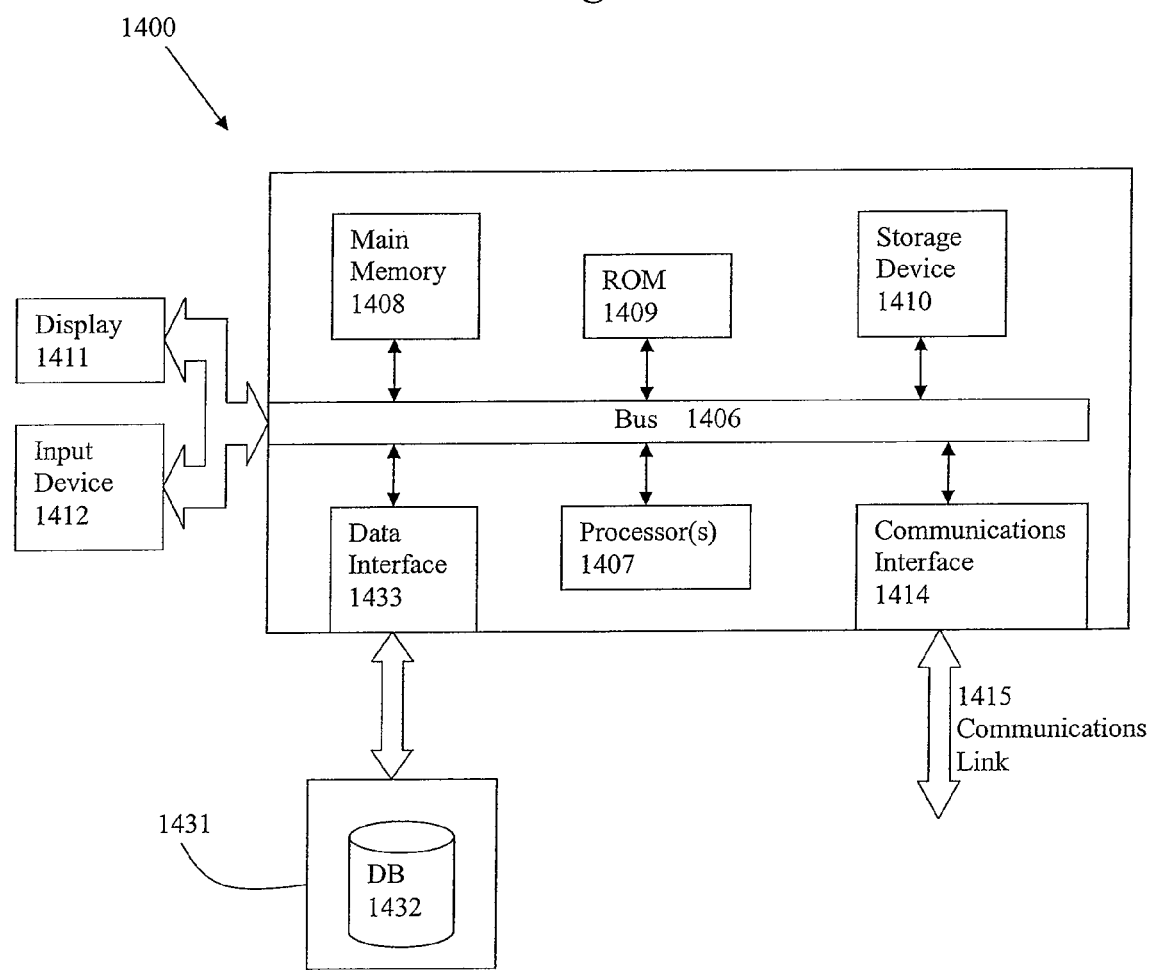
FIG. 9 illustrates an example computing architecture with which embodiments of the invention may be practiced.

FIG. 9 is a block diagram of an illustrative computing system 1400 suitable for implementing an embodiment of the present invention. Computer system 1400 includes a bus 1406 or other communication mechanism for communicating information, which interconnects subsystems and devices, such as processor 1407, system memory 1408 (e.g., RAM), static storage device 1409 (e.g., ROM), disk drive 1410 (e.g., magnetic or optical), communication interface 1414 (e.g., modem or Ethernet card), display 1411 (e.g., CRT or LCD), input device 1412 (e.g., keyboard), and cursor control.

According to one embodiment of the invention, computer system 1400 performs specific operations by processor 1407 executing one or more sequences of one or more instructions contained in system memory 1408. Such instructions may be read into system memory 1408 from another computer readable/usable medium, such as static storage device 1409 or disk drive 1410. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

The term "computer readable medium" or "computer usable medium" as used herein refers to any medium that participates in providing instructions to processor 1407 for execution. Such a medium may take many forms, including but not limited to, non-volatile media and volatile media. Non-volatile media includes, for example, optical or magnetic disks, such as disk drive 1410. Volatile media includes dynamic memory, such as system memory 1408.

Common forms of computer readable media includes, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 1400. According to other embodiments of the invention, two or more computer systems 1400 coupled by communication link 1415 (e.g., LAN, PTSN, or wireless network) may perform the sequence of instructions required to practice the invention in coordination with one another.

Computer system 1400 may transmit and receive messages, data, and instructions, including program, i.e., application code, through communication link 1415 and communication interface 1414. Received program code may be executed by processor 1407 as it is received, and/or stored in disk drive 1410, or other non-volatile storage for later execution.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

What is claimed is:

1. A method of analyzing spacing rules for an electronic design, comprising:
    identifying a first object on a layout of an electronic design, where the first object is associated with an extended spacing rule distance that exceeds a minimum spacing rule distance for the layout;
    determining, by using a processor, a shadow object, wherein the shadow object corresponds to a representation of the first object having a boundary that corresponds to the extended spacing rule distance;
    identifying a second object on the layout of the electronic design;
    determining whether a distance between the second object and the representation of the first object is less than the minimum spacing rule distance; and
    identifying a design violation if the distance between the second object and the representation of the first object is less than the minimum spacing rule distance such that the design violation is not detected unless the shadow object overlaps or intersects an analysis window of the second object.

2. The method of claim 1 in which the representation is created without changing the size of the data representation for the first object.

3. The method of claim 1 in which an analysis window is used to determine whether the distance between the second object and the representation of the first object is less than the minimum spacing rule distance, where the analysis window has boundaries that extend from the second object by the minimum spacing rule distance.

4. The method of claim 3 in which an overlap or intersection between the representation and the analysis window identifies a spacing rule violation.

5. The method of claim 1 in which the representation of the first object is created if the extended spacing rule distance that exceeds the minimum spacing rule distance for the layout by a threshold value.

6. The method of claim 5 in which the threshold value is an absolute value or a percentage of increased distance.

7. The method of claim 1 in which extended spacing rule distance corresponds to a width-dependent spacing rule.

8. The method of claim 1 in which the object comprises a combination of multiple smaller objects.

9. The method of claim 1 in which the first object comprises an irregularly proportioned object or set of objects.

10. The method of claim 9 in which the first object is decomposed into smaller regular objects, and the representation is based upon extended spacing rule distances for the smaller regular objects.

11. The method of claim 10 in which the smaller regular objects are formed based upon the smallest effective widths in the vertical and horizontal directions.

12. The method of claim 10 in which a logical OR operation is performed to determine the representation based upon the extended spacing rule distances for the smaller regular objects.

13. A system for analyzing spacing rules for an electronic design, comprising:
a processor for:
identifying a first object on a layout of an electronic design, where the first object is associated with an extended spacing rule distance that exceeds a minimum spacing rule distance for the layout;
determining a shadow object, wherein the shadow object comprises a representation of the first object having a boundary that corresponds to the extended spacing rule distance;
identifying a second object on the layout of the electronic design;
determining whether a distance between the second object and the representation of the first object is less than the minimum spacing rule distance; and
identifying a design violation if the distance between the second object and the representation of the first object is less than the minimum spacing rule distance such that the design violation is not detected unless the shadow object overlaps or intersects an analysis window of the second object.

14. The system of claim 13 in which the representation is created without changing the size of the data representation for the first object.

15. The system of claim 13 in which an analysis window is used to determine whether the distance between the second object and the representation of the first object is less than the minimum spacing rule distance, where the analysis window has boundaries that extend from the second object by the minimum spacing rule distance.

16. The system of claim 15 in which an overlap or intersection between the representation and the analysis window identifies a spacing rule violation.

17. The system of claim 13 in which the representation of the first object is created if the extended spacing rule distance that exceeds the minimum spacing rule distance for the layout by a threshold value.

18. The system of claim 17 in which the threshold value is an absolute value or a percentage of increased distance.

19. The system of claim 13 in which extended spacing rule distance corresponds to a width-dependent spacing rule.

20. The system of claim 13 in which the object comprises a combination of multiple smaller objects.

21. The system of claim 13 in which the first object comprises an irregularly proportioned object or set of objects.

22. The system of claim 21 in which the first object is decomposed into smaller regular objects, and the representation is based upon extended spacing rule distances for the smaller regular objects.

23. The system of claim 22 in which the smaller regular objects are formed based upon the smallest effective widths in the vertical and horizontal directions.

24. The system of claim 22 in which a logical OR operation is performed to determine the representation based upon the extended spacing rule distances for the smaller regular objects.

25. A computer program product comprising a non-transitory computer usable medium having a set of stored instructions, an execution of which by a processor causes a process to be performed, the process comprising:
identifying a first object on a layout of an electronic design, where the first object is associated with an extended spacing rule distance that exceeds a minimum spacing rule distance for the layout;
determining a shadow object without changing a size of a data representation of the first object, wherein the shadow object comprises a representation of the first object having a boundary that corresponds to the extended spacing rule distance;
identifying a second object on the layout of the electronic design;
determining whether a distance between the second object and the representation of the first object is less than the minimum spacing rule distance; and
identifying a design violation when the distance between the second object and the representation of the first object is less than the minimum spacing rule distance such that an analysis window of the second object will not detect the design violation unless the shadow object overlaps or intersects the analysis window.

26. The computer program product of claim 25 in which the representation of the first object is created when the extended spacing rule distance that exceeds the minimum spacing rule distance for the layout by a threshold value.

27. The computer program product of claim 25 in which the first object comprises an irregularly proportioned object or set of objects and the first object is decomposed into smaller regular objects, and the representation is based at least in part upon extended spacing rule distances for the smaller regular objects.

* * * * *